United States Patent
Anderson et al.

(10) Patent No.: US 7,557,597 B2
(45) Date of Patent: Jul. 7, 2009

(54) STACKED CHIP SECURITY

(75) Inventors: Brent Alan Anderson, Jericho, VT (US); Edmund Juris Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/145,423

(22) Filed: Jun. 3, 2005

(65) Prior Publication Data

US 2006/0273438 A1 Dec. 7, 2006

(51) Int. Cl.
G01R 31/02 (2006.01)
(52) U.S. Cl. .................. 324/763; 324/765; 714/734; 438/15
(58) Field of Classification Search .......... 324/763, 324/158.1, 765, 73; 438/14–18, 108–109; 714/732–734; 257/40, 48, 777, 778; 365/63, 365/226; 439/482
See application file for complete search history.

(56) References Cited

U.S. PATENT DOCUMENTS

| | | | | |
|---|---|---|---|---|
| 5,642,362 A | * | 6/1997 | Savir | 714/726 |
| 5,694,402 A | * | 12/1997 | Butler et al. | 714/732 |
| 6,002,177 A | | 12/1999 | Gaynes et al. | |
| 6,075,395 A | * | 6/2000 | Saeki | 327/161 |
| 6,150,724 A | * | 11/2000 | Wenzel et al. | 257/777 |
| 6,180,426 B1 | * | 1/2001 | Lin | 438/15 |
| 6,222,212 B1 | * | 4/2001 | Lee et al. | 257/207 |
| 6,351,681 B1 | * | 2/2002 | Chih et al. | 700/121 |
| 6,414,884 B1 | * | 7/2002 | DeFelice et al. | 365/195 |
| 6,646,459 B2 | * | 11/2003 | Habersetzer et al. | 324/763 |
| 6,721,196 B1 | | 4/2004 | Grassl | |
| 6,833,626 B2 | * | 12/2004 | Kajiwara et al. | 257/777 |
| 6,914,259 B2 | * | 7/2005 | Sakiyama et al. | 257/48 |
| 7,187,069 B2 | * | 3/2007 | Uematsu et al. | 257/685 |
| 2002/0163072 A1 | | 11/2002 | Gupta et al. | |
| 2004/0043535 A1 | | 3/2004 | Jeung et al. | |
| 2004/0048459 A1 | | 3/2004 | Patti | |

FOREIGN PATENT DOCUMENTS

JP 2002-217359 8/2002

* cited by examiner

*Primary Examiner*—Ha Tran T Nguyen
*Assistant Examiner*—Arleen M Vazquez
(74) *Attorney, Agent, or Firm*—George R. McGuire; Bond, Schoeneck & King, PLLC

(57) ABSTRACT

The present invention is directed to an integrated circuit module device. The device includes a first semiconductor chip having a first circuit layer and at least one first interconnection element disposed on a first chip surface. The at least one first interconnection element is electrically coupled to the first circuit layer. A second semiconductor chip includes a second circuit layer and at least one second interconnection element disposed on a second chip surface. The at least one second interconnection element is electrically coupled to the second circuit layer. The at least one first interconnection element is connected to the at least one second interconnection element to establish electrical continuity between the first circuit layer and the second circuit layer. The first surface is adjoined to the second surface. At least one ring delay circuit includes a first ring delay path partially disposed on the first circuit layer and a second ring delay path partially disposed on the second circuit layer. The first ring delay path and the second ring delay path form a signal path having a predetermined measurement signature. The ring delay circuit compares the predetermined measurement signature to a test measurement signature.

8 Claims, 4 Drawing Sheets

STACKED CHIP SECURITY

BACKGROUND OF THE INVENTION

1. Field of the Invention

The present invention relates generally to semiconductor devices, and particularly to integrated circuit modules.

2. Technical Background

Integrated circuits are thin semiconductor chips that include a large number of semiconductor devices, i.e., transistors and resistors, disposed thereon. A typical semiconductor chip may have a surface area of approximately 10 mm$^2$ to 600 mm$^2$. Examples of integrated circuits include microprocessors, signal processors, and volatile and non-volatile memory devices.

Integrated circuits are fabricated by various steps that result in a circuit layer being disposed on a semiconductor wafer. The wafer may be comprised of silicon, gallium arsenide, or other such materials. For example, in some special applications, a substrate is formed by disposing silicon on sapphire. Photolithographic techniques are used to pattern the wafer. Repeated steps of deposition, patterning and etching are performed to build three-dimension circuit structures. Layers of resist, polysilicon, and other materials may be deposited on the substrate and later etched away to further define the circuit structure. After circuit elements such as transistors and resistors are constructed, these elements are interconnected by vias and lead lines. The interconnections may be formed, for example, by sputtering or electro-plating. The interconnection material may be aluminum, copper, or other metallic materials. Numerous integrated circuits are typically disposed on a single wafer. The wafer is subsequently cut into dies, or semiconductor chips.

Obviously, the speed at which signals propagate within an integrated circuit is a function of the surface area of the chip. In other words, the larger the separation distance between two circuit components, the slower the speed at which they are able to communicate. Accordingly, there is a need to reduce the length of the signal path to thereby increase the overall speed of the device.

In one approach that has been considered, the maximum signal distance is reduced by stacking integrated circuit chips in a three-dimensional structure. The length of the signal path is reduced because vertical distance between chip layers is generally smaller than the surface area of the chip itself. The cost of a two chip solution is also typically less for medium chip sizes due improved yields and process optimization for each chips content. However, one drawback to the stacked multi-chip approach relates to providing signal security. The chip layers may be separated to expose the chip interconnection points or the interconnections may be probed. Both allow the chip interconnection signals to be intercepted and monitored. What is needed is an integrated circuit module that prevents interconnection signals from being intercepted and monitored.

SUMMARY OF THE INVENTION

The present invention addresses the need described above. The present invention provides an integrated circuit module that prevents interconnection signals from being intercepted and monitored. The present invention provides an integrated circuit that periodically self-monitors the chip signal paths to thereby determine whether module security has been compromised. If the self-testing indicates that the module tampering has occurred, the module disables itself One aspect of the present invention is directed to an integrated circuit module device. The device includes a first semiconductor chip having a first circuit layer and at least one first interconnection element disposed on a first chip surface. The at least one first interconnection element is electrically coupled to the first circuit layer. A second semiconductor chip includes a second circuit layer and at least one second interconnection element disposed on a second chip surface. The at least one second interconnection element is electrically coupled to the second circuit layer. The at least one first interconnection element is connected to the at least one second interconnection element to establish electrical continuity between the first circuit layer and the second circuit layer. The first surface is adjoined to the second surface. At least one ring delay circuit includes a first ring delay path partially disposed on the first circuit layer and a second ring delay path partially disposed on the second circuit layer. The first ring delay path and the second ring delay path form a signal path having a predetermined measurement signature. The at least one ring delay circuit is configured to compare the predetermined measurement signature to a test measurement signature.

In another aspect, the present invention includes a method for making an integrated circuit module. The method includes the step of providing a first semiconductor chip including a first circuit layer and at least one first interconnection element disposed on a first chip surface. The at least one first interconnection element is electrically coupled to the first circuit layer. The first circuit layer includes a first ring delay path of at least one ring delay circuit. A second semiconductor chip is provided that includes a second circuit layer and at least one second interconnection element disposed on a second chip surface. The at least one second interconnection element is electrically coupled to the second circuit layer. The second layer includes a second ring delay path of the at least one ring delay circuit. The at least one first interconnection element is connected to the at least one second interconnection element to establish electrical continuity between the first circuit layer and the second circuit layer. Electrical continuity also is established between the first ring delay path and the second ring delay path to thereby form a signal path having a predetermined measurement signature such that the first surface is adjoined to the second surface. The predetermined measurement signature is compared to a test measurement signature.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
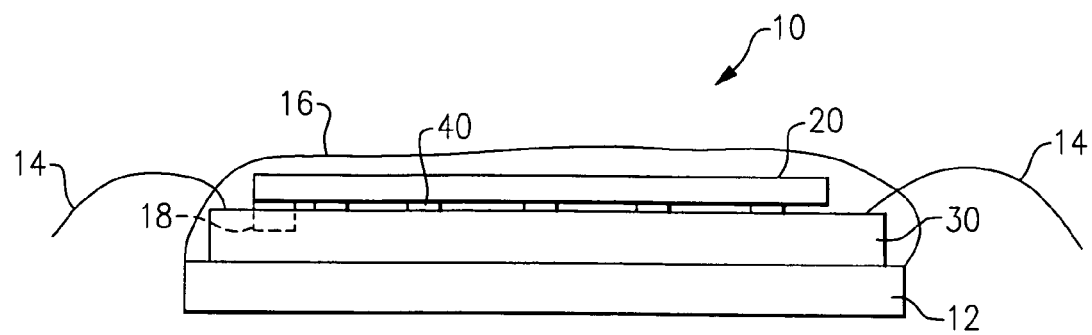
FIG. 1 is a sectional view of an integrated circuit module in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An embodiment of the integrated circuit module of the present invention is shown in FIG. 1, and is designated generally throughout by reference numeral 10.

As embodied herein, and depicted in FIG. 1, a sectional view of an integrated circuit module 10 in accordance with one embodiment of the present invention is shown. Module 10 includes a semiconductor chip 20. Chip 20 is coupled to another semiconductor chip 30 by way of interconnections 40. A capacitor circuit 18 may be disposed between chip 20 and chip 30. If an attempt is made to separate chip 20 from chip 30, the capacitor is discharged and module 10 is disabled. Capacitor 18 may be charged during device programming. The device is configured such that the charge is maintained for the life of the module. Module 10 also includes electrical leads 14 coupled to chip 30. Leads 14 may be coupled to chip 30 by wire-bonding or other suitable techniques. Chip 30 is further disposed and coupled to a chip carrier 12. The stacked chip module is subsequently coated and sealed by a relatively hard material 16 to prevent access to the interior of module 10. Those of ordinary skill in the pertinent art will understand that any suitable material may be employed. For example, coating 16 may be a glass material.

As noted above, chips 20, 30 are cut and fabricated from a semiconductor wafer. In the manner previously described, a circuit layer is disposed on each semiconductor substrate. Of course, the circuit layer includes integrated circuits that may be comprised of millions or billions of circuit elements. After the device elements are disposed on the wafer, various metals and insulating materials are patterned on the device to interconnect the elements. According to the present invention, the device elements may be interconnected, of course, to create microprocessors, signal processors, memory devices, logic circuits, programmable gate arrays, and/or other such circuits. The present invention should not be construed as being limited thereto.

The semiconductor chip 20 parent wafer is typically thinned prior to dicing. The thickness may typically range from 10 micrometers to several hundred micrometers. Chip 20 may also be thinned by back grinding or by chemical/mechanical polishing (CMP) after dicing. A thin top chip is a security feature of the present invention. By thinning chip 20, any effort to separate chip 20 from chip 30 after integration will result in chip 20, the circuits disposed thereon, being damaged. Accordingly, module 10 will cease to function.

Figure 2:
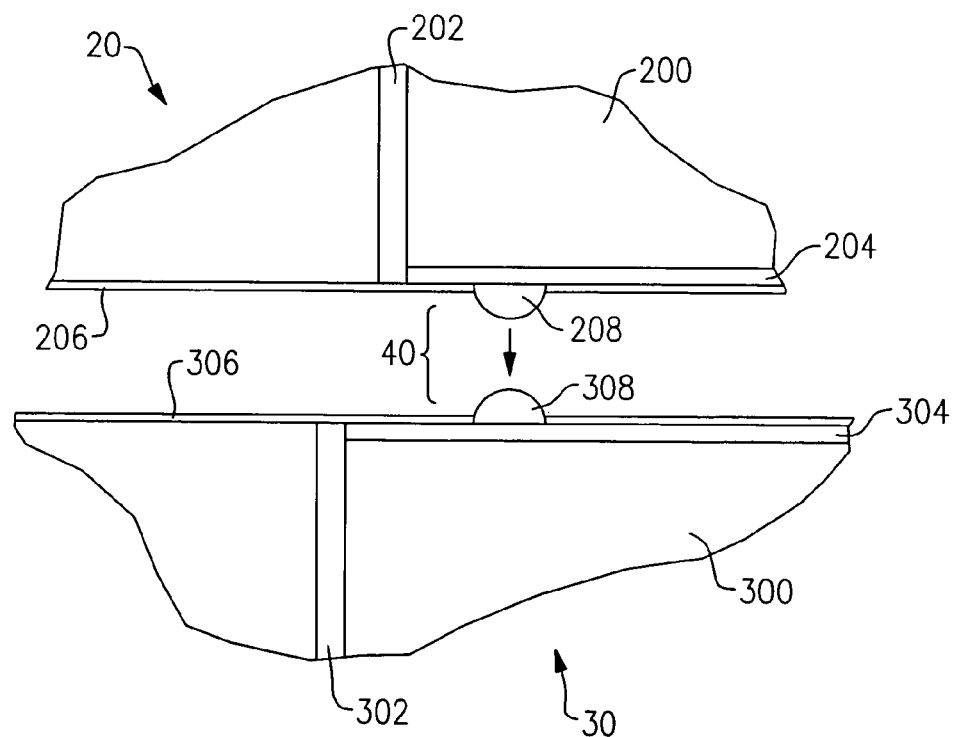
FIG. 2 is a detail view of the module depicted in FIG. 1.

Referring to FIG. 2, a detail view of the module depicted in FIG. 1 is disclosed. FIG. 2 provides a very simplified diagram of chip interconnection. Chip 20 includes a circuit layer 200. Layer 200 includes a vias 202 having a conductive material disposed therein. Various electrical leads 204 are disposed in layer 200. Solder bumps 208 are connected to leads 204. Similar structures 300, 302, 304 and 308 are disposed on chip 30. Modifications and variations can be made to the method of disposing interconnection elements 208, 308 on their respective circuit layers. For example, the interconnection elements may be disposed on the circuit layer by using evaporation techniques, electroplating or by other suitable means. Bumps 208, 308 may consist of a solder having a low melting point. After chip 20 is flipped onto chip 30, an appropriate temperature is applied until the solder reflows. In another embodiment, both pressure and heat is applied to make interconnection 40. As shown in FIG. 20, reference numeral 206 identifies a surface layer on chip 20 and reference numeral 306 identifies a surface layer on chip 30.

Figure 3:
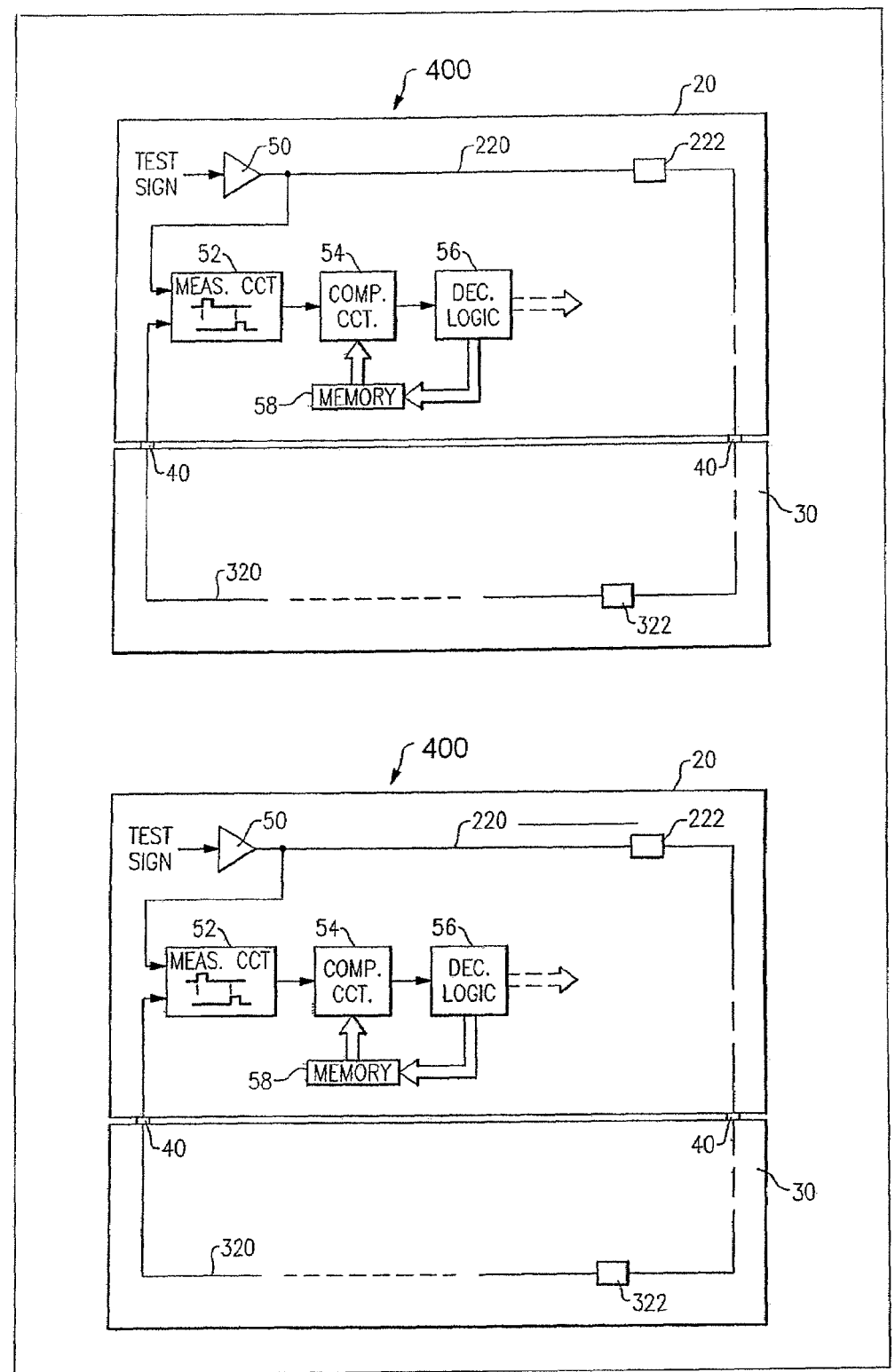
FIG. 3 is a block diagram of a ring delay circuit in accordance with an embodiment of the present invention.

As embodied herein, and depicted in FIG. 3, a block diagram of a ring delay circuit 400 in accordance with an embodiment of the present invention is disclosed. As shown in FIG. 3, the ring delay circuit 400 is partially disposed on chip 20 and partially disposed on chip 30. Delay circuit 400 includes signal input element 50. Input device 50 is configured to direct a test signal onto circuit path 220. Circuit path 220 may include one or more circuit elements 222. Of course, in a typical integrated circuit, there may be millions of circuit elements 222. The test signal propagates through interconnection 40 and along the circuit path 320 through each circuit element 322 disposed in path 320. Relevant characteristics of the return test signal and the input test signal are measured by circuit 52. These characteristics correspond to a measured signature. The measured signature may then be compared with a predetermined signature value by circuit 54. The results of the comparison are directed into decision logic 56. If the comparison value is not within a predetermined range of values, decision logic 56 disables module 10.

FIG. 3 is a representative example, a typical chip delay path would include hundreds or thousands of interconnects 40 and thousands of circuit elements 222 between each interconnect. Also, there are numerous ring delay circuits that are disposed around the perimeter of the chip. Accordingly, there are no gaps that would allow someone to gain access into the interior of the device. Of course, each ring delay circuit is characterized by its own signature. Furthermore, because of process variations in producing chips 20, 30, each module 10 is unique. This feature prevents someone from separating one module to determine the module characteristics and using these characteristics to gain access to a second module device.

Those of ordinary skill in the pertinent art will recognize that each circuit element or component has certain characteristics associated with it. These characteristics are a function of the physical attributes of the semiconductor device and the circuits disposed thereon. The characteristics may include, but are not limited to an average pulse delay, pulse magnitude or attenuation characteristics, pulse spreading characteristics, or any other suitable measurements. These characteristics may be employed directly to determine the signature. On the other hand, these characteristics may impact bit alignment, or result in the presence of extraneous bits or clock periods in a return signal. Accordingly, any number of characteristics, taken alone or in combination, may be used as the signature. Further, each signal path on a given chip has its own "signature" that may be derived from the above described characteristics.

Figure 4:
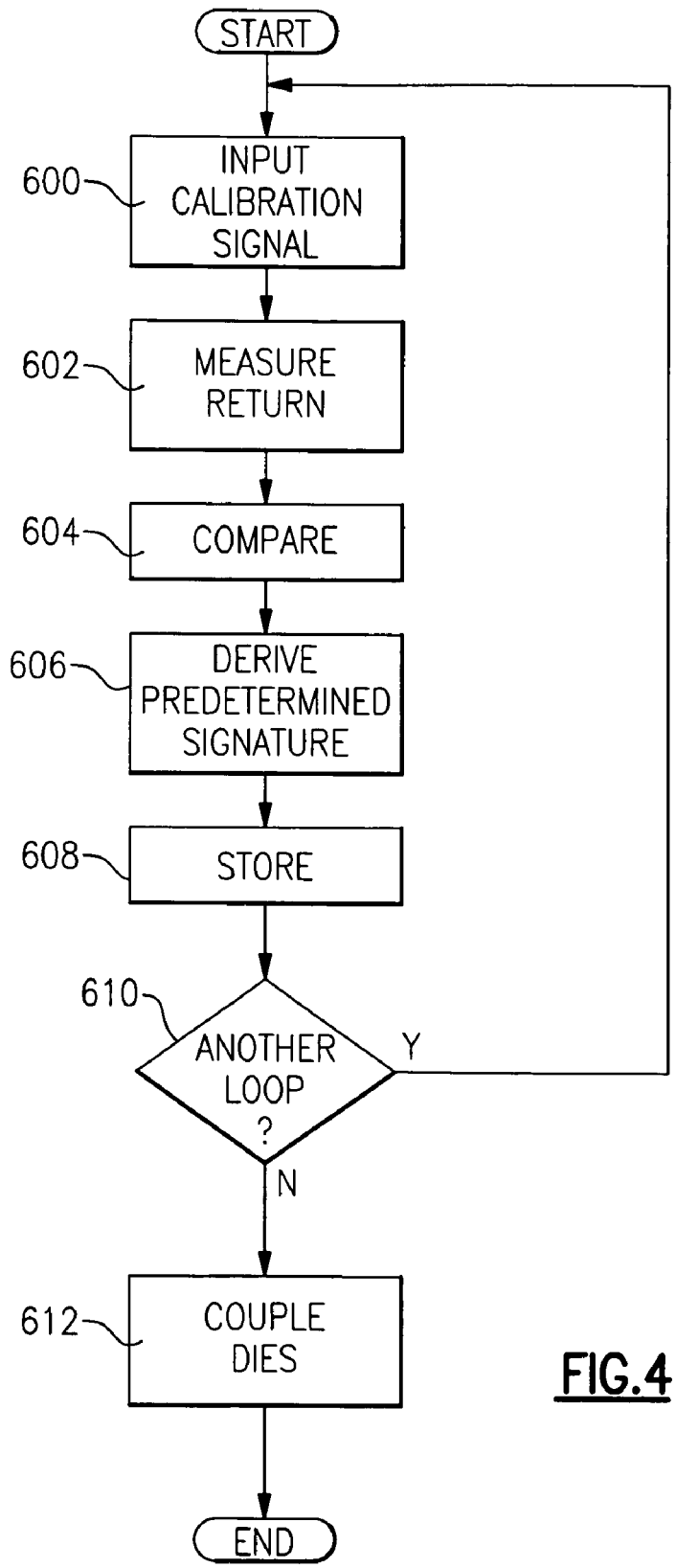
FIG. 4 is a chart showing a method for making and calibrating an integrated circuit module in accordance with yet another embodiment of the present invention.

FIG. 4 is a chart showing a method for making and calibrating an integrated circuit module in accordance with yet another embodiment of the present invention. Before chip 20 and chip 30 are coated with the hard material, the module is programmed and tested. Part of the calibration procedure relates to calibrating the module 10 to determine the predetermined signature values. Accordingly, in step 600, a calibration signal is directed into a signal path. One or more signal path characteristics of the calibration signal are measured after the calibration signal traverses the signal path. As noted above, the characteristics may include pulse delay, pulse magnitude or attenuation characteristics, pulse spreading characteristics, or any other suitable measurement that may indicate that a probe is being interposed at a chip interconnection point. In steps 602 and 604 return measurement data is collected and compared with the characteristics of the calibration input signal. Thus, the predetermined signature value for the signal path under test is empirically derived and stored in a portion of the memory 58 disposed in module 10. If there is another relay loop/circuit that requires calibration, the process is repeated or can be done in parallel. If required, additional back-end processing may be performed, such as wire-bonding, coating, and module encapsulation. Further testing on module 10 may be performed as well.

An alternative method is to complete back-end processing prior to programming the module.

Figure 5:
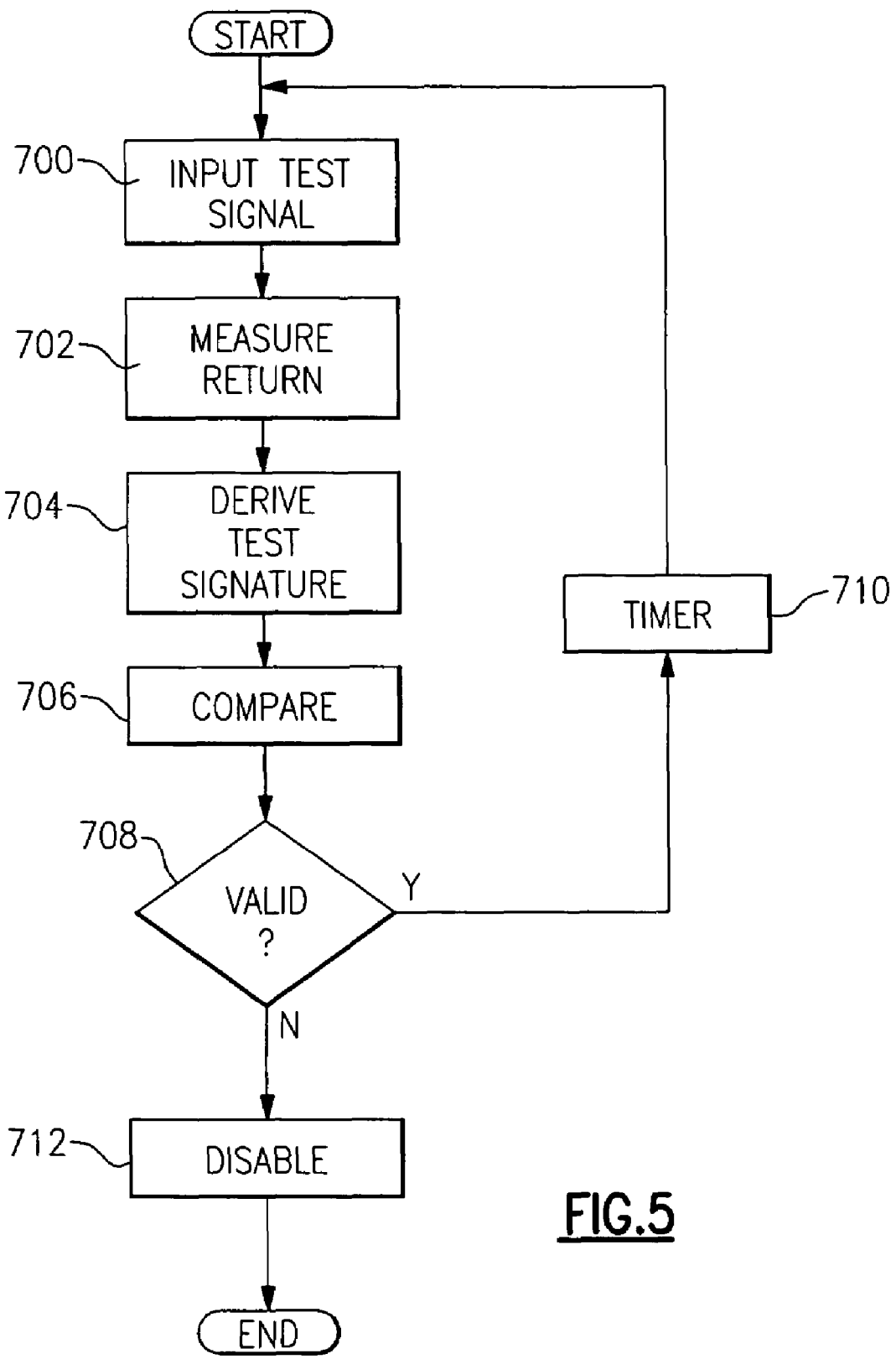
FIG. 5 is a chart showing a method for using an integrated circuit module in accordance with yet another embodiment of the present invention.

FIG. 5 is a chart showing a method for security testing the integrated circuit module. Once module 10 is employed in an application, it is configured to periodically or continuously perform security self-testing. In step 700, signal input device 50 (FIG. 3) directs an input signal into a signal path. In the manner described above, one or more characteristics of the return signal, or signals, are measured relative to their corresponding input signals. In step 704, a test measurement signature is derived for each delay circuit 400 in module 10. In step 706, the measured signature, or signatures, are compared to the predetermined signature or signatures. If the measured values correspond to the predetermined values, the test is conducted after a predetermined period of time, as indicated by timer 710. If not, module 10 is disabled.

As noted previously, there are typically numerous ring delay circuits disposed in module 10. For example, a module 10 may include tens (10s) or hundreds (100s) or more ring delay circuits. Accordingly, this process will be repeated in each of these circuits. Again, each ring delay circuit in the module would have its own signature. The measurement circuitry disposed in each delay circuit 400 is configured to derive a test path measurement signature from each test signal traversing each signal path in the manner described above. The measurement circuitry (52, 54, 56) comparing each test path measurement signature to a corresponding predetermined path signature stored in memory 58. The measurement circuitry is included on-chip because each module is unique.

In one embodiment of the present invention, the test signal is a single pulse. The timing of the return pulse is measured relative to the input pulse. In this embodiment, the measured signature, in this case a time delay, is provided to comparison circuit 54. Comparison circuit 54 also obtains a predetermined signature from memory 58. Comparison circuit determines whether the measured signature compares favorably to the predetermined signature. A difference value is provided to the decision logic. If the measured signal is not within a predetermined range, the decision logic determines that the path length of the test signal path has been significantly altered, and disables module 10 in response thereto. Those of ordinary skill in the pertinent art will recognize that a significant lengthening of the path may be the result of a probe being inserted into module 10 to monitor chip interconnection signals. A monitoring device interposed between the two chips will cause the signal pulse to traverse a longer path. Those of ordinary skill in the pertinent art will also recognize that other pulse characteristics may be measured, such as pulse spreading, attenuation, and etc.

In another embodiment, the test input device is configured to transmit a predetermined bit pattern onto signal path 220. The bit pattern traverses the path in the manner described above. Measurement circuit 52 is configured to measure the serial data alignment of the predetermined bit pattern after the predetermined bit pattern traverses the signal path. The predetermined signature in this embodiment relates to the number of clock pulses it takes for the serial bit stream to traverse the path. Decision logic circuit 56 disables module 10 if the serial data alignment exceeds a predetermined number of bits relative to the synchronization clock (not shown).

In yet another embodiment, the predetermined measurement signature includes a sequence of the predetermined path signatures. The measurement circuitry measures a sequence of test path measurement signatures. These values are then compared to a sequence of predetermined path signatures.

In another embodiment, the predetermined module signature corresponds to a sequence of predetermined difference values. Each predetermined difference value is calculated by taking a difference between a first predetermined path signature value and a second predetermined path signature value. As such, an aggregate predetermined measurement signature corresponds to a sequence of predetermined difference values. During testing, therefore, the test measurement signature corresponds to a sequence of test difference values. Each test difference value is a difference between a first test path measurement signature and a second test path measurement signature. A comparison circuit compares the sequence of test difference values with the sequence of predetermined difference values.

In another embodiment, intermediate points in the circuit path may be measured and similar comparisons made to determine if the signal path has been disturbed.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An integrated circuit module device comprising:
a first semiconductor chip including a first surface and a first interconnection element; a second semiconductor chip including a second surface and a second interconnection element, said first interconnection element being electrically connected to said second interconnection element, said first surface being adjoined to said second surface; and a ring delay circuit located on said first and second semiconductor chip, said ring delay circuit being structured to receive a test signal, to return a test signal, and to measure a measured ring delay signature based at least in part on the received test signal and the returned test signal; wherein said ring delay circuit comprises: a signal input element structured to receive the received test signal; a circuit path structured to receive the test signal from said signal input element and to convert the received test signal into a corresponding returned test signal, said circuit path comprising said first interconnection element and said second interconnection element; and a measuring circuit structured to receive the returned test signal from said circuit path and to measure the measured ring delay signature based at least in part on the received test signal and the returned test signal.

2. The device of claim 1, wherein said ring delay circuit is further structured to compare the measured ring delay signature with a predetermined ring delay signature in order to determine a comparison value.

3. The device of claim 2, further comprising a decision logic circuit structured to receive the comparison value and determine whether the comparison value is within a predetermined comparison value range.

4. The device of claim 3, wherein said decision logic circuit is structured to disable the device if the decision logic circuit determines that the comparison value is not within the predetermined comparison value range.

5. The device of claim 1, wherein said ring delay circuit further comprises a comparison circuit structured to compare the measured ring delay signature with the predetermined ring delay signature in order to determine the comparison value.

6. The device of claim 1, further comprising a decision logic circuit structured to receive the comparison value from said comparison circuit and to determine whether the comparison value is within the predetermined comparison value range.

7. The device of claim 1 wherein the measured ring delay signature comprises at least one of the following characteristics: average pulse delay; pulse magnitude; attenuation; and/or pulse spreading.

8. The device of claim 1 wherein the ring delay circuit is structured to continuously or periodically perform self-testing after being employed in an application.

* * * * *